(12) United States Patent
Alvarez et al.

(10) Patent No.: US 8,916,871 B2
(45) Date of Patent: Dec. 23, 2014

(54) BONDABLE TOP METAL CONTACTS FOR GALLIUM NITRIDE POWER DEVICES

(75) Inventors: Brian Joel Alvarez, San Jose, CA (US); Donald R. Disney, Cupertino, CA (US); Hui Nie, Cupertino, CA (US); Patrick James Lazlo Hyland, San Jose, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 13/611,467

(22) Filed: Sep. 12, 2012

(65) Prior Publication Data

US 2014/0070226 A1    Mar. 13, 2014

(51) Int. Cl.
*H01L 29/10* (2006.01)
*H01L 23/48* (2006.01)

(52) U.S. Cl.
USPC .............. 257/44; 257/54; 257/81; 257/734; 257/748; 257/E23.16

(58) Field of Classification Search
CPC ......... H01L 23/00; H01L 24/01; H01L 29/00; H01L 29/40; H01L 29/401
USPC .............. 257/44, 54, 73, 79, 81, 94, 99, 183, 257/266, 267, 280, 472, 473, 613, E23.16, 257/E29.146, E29.328, 734, 748
See application file for complete search history.

(56) References Cited

U.S. PATENT DOCUMENTS

| | | | |
|---|---|---|---|
| 2007/0090481 A1* | 4/2007 | Richieri | 257/473 |
| 2011/0012169 A1* | 1/2011 | Takizawa et al. | 257/103 |
| 2012/0012968 A1* | 1/2012 | Konsek | 257/472 |
| 2012/0037918 A1* | 2/2012 | Miyazaki et al. | 257/76 |
| 2012/0049372 A1* | 3/2012 | Hamerski | 257/754 |
| 2012/0223337 A1* | 9/2012 | Terano et al. | 257/77 |
| 2013/0087879 A1* | 4/2013 | Edwards et al. | 257/472 |
| 2013/0126885 A1* | 5/2013 | Disney et al. | 257/76 |

\* cited by examiner

*Primary Examiner* — Galina Yushina
(74) *Attorney, Agent, or Firm* — Kilpatrick Townsend & Stockton LLP

(57) ABSTRACT

An embodiment of a semiconductor device includes a gallium nitride (GaN) substrate having a first surface and a second surface. The second surface is substantially opposite the first surface, at least one device layer is coupled to the first surface, and a backside metal is coupled to the second surface. A top metal stack is coupled to the at least one device layer. The top metal stack includes a contact metal coupled to a surface of the at least one device layer, a protection layer coupled to the contact metal, a diffusion barrier coupled to the protection layer, and a pad metal coupled to the diffusion barrier. The semiconductor device is configured to conduct electricity between the top metal stack and the backside metal.

10 Claims, 15 Drawing Sheets

US 8,916,871 B2

BONDABLE TOP METAL CONTACTS FOR GALLIUM NITRIDE POWER DEVICES

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to providing a bondable top metal contact for vertical semiconductor devices. Merely by way of example, the invention has been applied to methods and systems for manufacturing vertical GaN power devices. The methods and techniques can be applied to a variety of vertical semiconductor devices, such as metal-oxide-semiconductor field-effect transistors (MOSFETs), bipolar transistors (BJTs, HBTs), diodes, and the like.

An embodiment of a semiconductor device, according to the disclosure, can include a gallium nitride (GaN) substrate having a first surface and a second surface. The second surface is substantially opposite the first surface, at least one device layer can be coupled to the first surface, and a backside metal can be coupled to the second surface. A top metal stack can be coupled to the at least one device layer. The top metal stack can include a contact metal coupled to a surface of the at least one device layer, a protection layer coupled to the contact metal, a diffusion barrier coupled to the protection layer, and a pad metal coupled to the diffusion barrier. The semiconductor device can be configured to conduct electricity between the top metal stack and the backside metal.

An embodiment of a method for fabricating a vertical GaN power device, according to the disclosure, can include providing a GaN substrate having a first surface and a second surface, where the second surface is substantially opposite the first surface. The method also can include forming at least one device layer coupled to the first surface, forming a backside metal coupled to the second surface, and forming a top metal stack. The top metal stack can a contact metal coupled to a surface of the at least one device layer, a protection layer coupled to the contact metal, a diffusion barrier coupled to the protection layer, and a pad metal coupled to the diffusion barrier. The semiconductor device can be configured to conduct electricity between the top metal stack and the backside metal.

A second embodiment of a semiconductor device, according to the disclosure, can include a GaN substrate having a first surface and a second surface, where the second surface is substantially opposite the first surface. At least one device layer can be coupled to the first surface. A backside metal can be coupled to the second surface. The backside metal can comprise an adhesion layer coupled to the second surface of the GaN substrate, a first diffusion barrier coupled to the adhesion layer, and a first protection layer coupled to the first diffusion barrier. A top metal stack can be coupled to the at least one device layer. The top metal stack can comprise a contact metal coupled to a surface of the at least one device layer, a second protection layer coupled to the contact metal, a second diffusion barrier coupled to the second protection layer, and a pad metal coupled to the diffusion barrier. The semiconductor device can be configured to conduct electricity between the top metal stack and the backside metal.

Numerous benefits are achieved by way of the present invention over conventional techniques. For example, embodiments of the present invention enable a top metal contact (e.g., bond pad) of a semiconductor device to be bonded with high current, low resistivity aluminum bond wires. Techniques provided herein further allow for passivation before the top metal contact's metal stack is complete, enabling the semiconductor device to be exposed to other processing steps before the complete metal stack is formed. These and other embodiments of the invention, along with many of its advantages and features, are described in more detail in conjunction with the text below and attached figures.

Figure 1A:
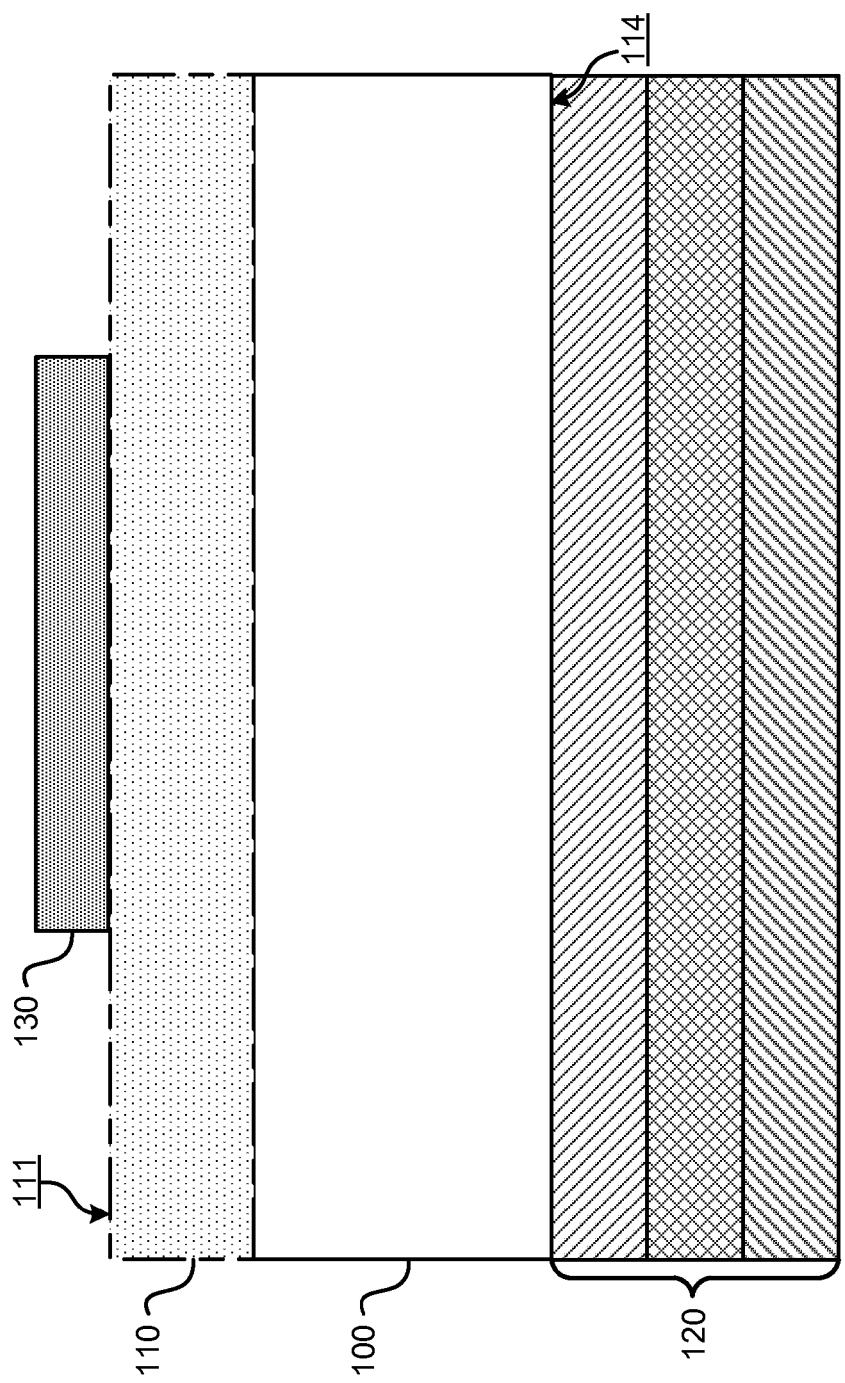
FIGS. 1A-1B are simplified cross-sectional diagrams illustrating two embodiments of vertical semiconductor devices.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

The present invention relates generally to electronic devices. More specifically, the present invention relates to providing a bondable contact metal for vertical semiconductor devices. Merely by way of example, the invention has been applied to methods and systems for manufacturing vertical GaN power devices. The methods and techniques can be applied to a variety of vertical semiconductor devices, such as metal-oxide-semiconductor field-effect transistors (MOSFETs), bipolar transistors (BJTs, HBTs), diodes, and the like.

Furthermore, techniques for providing a bondable contact metal may be used in conjunction with techniques for providing a solderable back metal, also disclosed herein. These techniques for providing a solderable back metal are also provided in U.S. patent application Ser. No. 13/552,365, filed Jul. 18, 2012, entitled "GAN POWER DEVICE WITH SOLDERABLE BACK METAL", which is incorporated by reference into this application for all purposes.

GaN-based electronic and optoelectronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, μ, is higher than competing materials for a given background doping level, N. This provides low resistivity, ρ, because resistivity is inversely proportional to electron mobility, as provided by equation (1):

$$\rho = \frac{1}{q\mu N}, \qquad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \qquad (2)$$

where A is the cross-sectional area of the channel or current path.

These superior properties can give rise to improved semiconductor devices, such as vertical semiconductor devices. Traditional semiconductor devices are typically lateral devices that utilize only the top side of a semiconductor wafer, locating electrical contacts such that electricity travels laterally along the semiconductor surface. This tends to consume a large footprint on the semiconductor. Vertical semiconductor devices, on the other hand, utilize a smaller footprint to achieve the same performance as lateral devices. Vertical semiconductor devices have electrical contacts on both the top surface of the semiconductor and on the bottom surface, or backside, such that electricity flows vertically between the electrical contacts. Vertical power devices are vertical semiconductor devices that can be utilized in high power and/or high voltage applications.

Figure 1B:
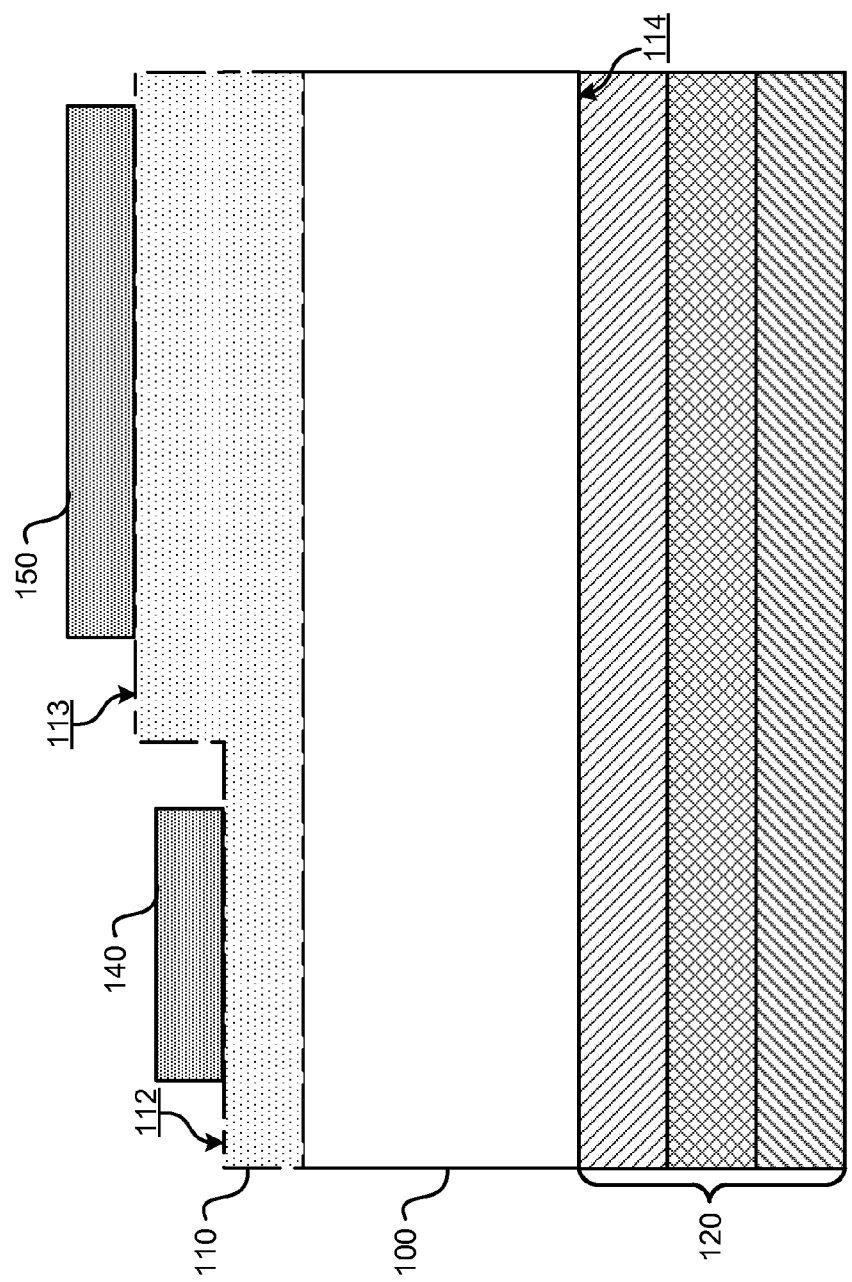

FIGS. 1A-1B are simplified cross-sectional diagrams illustrating two embodiments of vertical semiconductor devices. In general, embodiments can include a GaN substrate 100, device layer(s) 110, one or more metal contacts 130, 140, 150 on a top surface, and a backside metal 120. Although embodiments shown in FIGS. 1A-1B and elsewhere herein describe the use of GaN materials, it will be understood that other semiconductor materials, including III-nitride semiconductor materials, can be used.

The form and function of the device layer(s) 110 can vary significantly, depending on desired functionality. Device layer(s) 110 can include, for example, one or more active regions, drift regions, PN junctions, P-I-N junctions, doped regions, intrinsic regions, insulating regions, and/or the like, depending on the functionality of the vertical semiconductor device. Examples of vertical semiconductor devices can include JFETs, MOSFETs, MESFETS, BJTs, HBTs, diodes, and the like.

Vertical semiconductor devices can have one or more metal contacts 130, 140, 150 on a top surface, depending on the type of device. The embodiment in FIG. 1A, for example includes a single metal contact 130 on a top surface 111 of the vertical semiconductor device. Such a device can include, for example, a diode. On the other hand, as shown in FIG. 1B, other embodiments of vertical semiconductor devices, such as transistors, can include multiple metal contacts 140, 150 in order to achieve additional device functionality. The metal contacts can be on a single top surface (not shown) or multiple top surfaces 112, 113, depending on the structure of the device layer(s) 110.

The vertical semiconductor devices of FIGS. 1A-1B also include a backside metal 120. Backside metals (also referred to herein as "back metals") are metals coupled to a bottom surface 114 of a semiconductor device. These backside metals 120 can be utilized in the packaging of semiconductor devices to provide a mechanical attachment to the semiconductor device's housing or package. Backside metals 120 can also provide a thermally conductive pathway for heat to be removed from the semiconductor device. Furthermore, in the case of vertical semiconductor devices, backside metals 120 can provide a low-resistivity path for current to flow in a vertical direction through the device, from a top surface through the device layer(s) 110 to the bottom surface 114 of the GaN substrate 100, and/or vice versa. This low resistivity connection facilitating vertical current flow is particularly beneficial for vertical power devices. As indicated in FIGS. 1A-1B, a backside metal 120 can include one or more metal layers. Furthermore, in some embodiments, multiple metal contacts may be formed from a backside metal 120, similar to the multiple metal contacts 140, 150 shown in FIG. 1B, depending on device functionality.

Often, backside metals are not solderable. Traditional, non-vertical devices, for example, typically include all electrical contacts on a top surface of the semiconductor. Therefore, there is not a need to electrically connect a backside metal to a lead frame. Accordingly, in many cases, devices are attached to a package with electrically insulating epoxy or electrically conductive (e.g. silver filled) epoxy, which is much less thermally conductive and has a much higher electrical resistivity than solder. Solder, on the other hand, has very good electrical and thermal conductivity. It is also known for good reliability under temperature cycling and environmental testing using high humidity levels at elevated temperatures. Therefore, for semiconductors requiring electrical and mechanical backside connections, such as vertical power devices, the backside metal of the semiconductor device can be soldered to the metal lead frame of an electronic package. Because vertical power devices using GaN and/or other III-nitride materials are only now in development, little has been done to form solderable backside metals to these devices.

The manufacture of vertical semiconductor devices in GaN and/or other III-nitride materials can be carried out in a variety of ways. FIGS. 2-7 illustrate a particular embodiment of a process for creating a solderable back metal on a vertical semiconductor device. Although the figures show only one vertical semiconductor device, the process described can be extended and/or modified to include the simultaneous manufacture of multiple vertical semiconductor devices.

Figure 2:
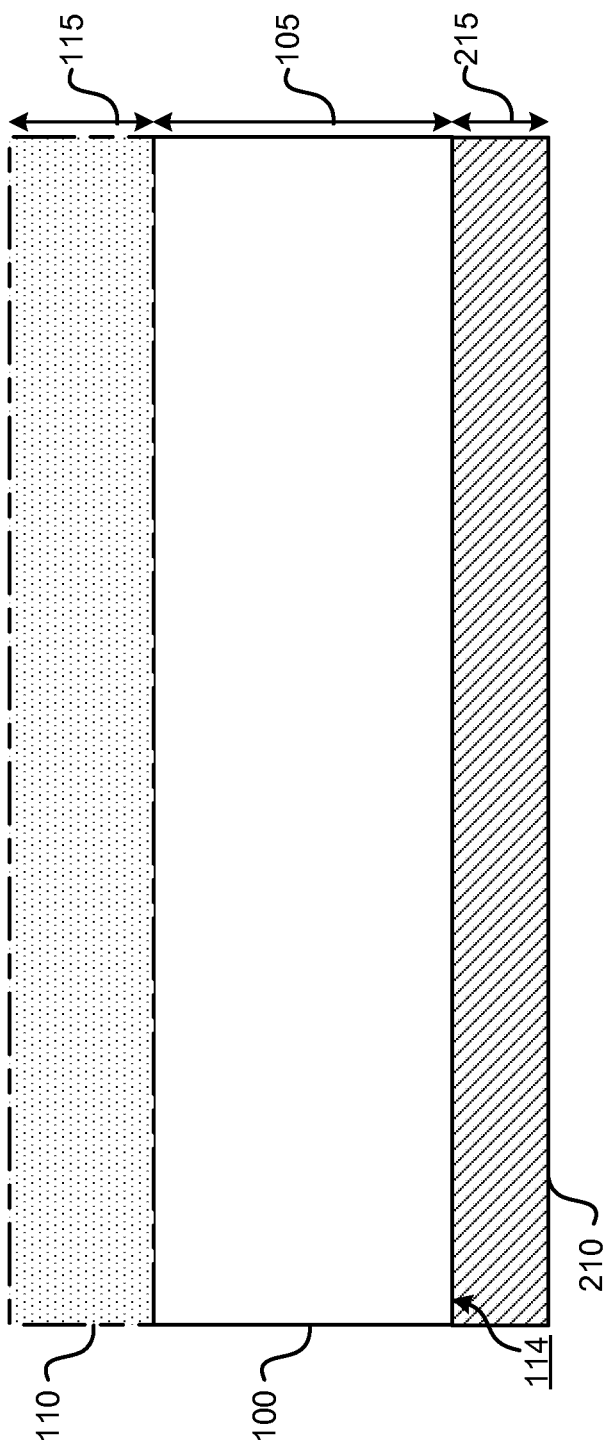
FIGS. 2-6 are simplified cross-sectional diagrams illustrating a process for creating a solderable back metal on a vertical semiconductor device and attaching the device to a package, according to an embodiment of the present invention.

Referring to FIG. 2, an adhesion layer 210 is formed on a bottom surface of a vertical semiconductor device, which includes a GaN substrate 100 and device layer(s) 110. Adhesion layer 210 may comprise a titanium (Ti), aluminum (Al), palladium (Pd), chrome (Cr), or a Ti and Al stack (e.g., a layer of Ti coupled to the back of the GaN substrate 100, and a layer of Al coupled to the layer of Ti). Adhesion layer 210 is also referred to herein as an Ohmic adhesion layer, because this layer should provide a good Ohmic contact to GaN substrate 100. In some embodiments, the specific contact resistance between adhesion layer 210 and GaN substrate 100 is less than $1 \times 10^{-4}$ ohm-cm$^2$. Experimental results have revealed that Al alone can be used as the adhesion layer 210 because it can form an Ohmic contact with the GaN substrate 100 without requiring a high-temperature anneal. This can be advantageous because it can simplify the processing of the devices and remove the possibility of an anneal negatively affecting other aspects of the vertical semiconductor device. In one embodiment, unannealed Al is utilized as an adhesion layer 210 on a surface of a GaN substrate 100 having n-type conductivity. Embodiments typically contemplate forming the adhesion layer 210 on the nitrogen surface of the GaN substrate 100, although other embodiments may include forming the adhesion layer 210 on the gallium surface.

The thickness 215 of the adhesion layer 210 can vary. For example, the thickness 215 of the adhesion layer 210 could be in the range of 5-300 nanometers thick. Furthermore, the respective thicknesses 105, 115 of the GaN substrate 100 and the device layer(s) 110, as well as other properties (e.g., dopant concentration, shape, composition, etc.), also can vary depending on the type of semiconductor devices being fabricated, desired functionality, manufacturing concerns, and/or other factors. Although the GaN substrate 100 is illustrated as including a single material composition, multiple layers can be provided as part of the substrate. Moreover, adhesion, buffer, and other layers (not illustrated) can be utilized during an epitaxial growth process. One of ordinary skill in the art would recognize many variations, modifications, and alternatives.

Some embodiments may include processes that involve polishing and/or other processing the bottom surface 114 of the GaN substrate 100 before the adhesion layer 210 is formed. For example, a GaN substrate 100 can be thinned, after the majority of device processing is completed, to reduce the on-state resistance of the device and lessen the thermal resistance of the device to lower operating temperature and improve its efficiency. The GaN substrate 100 can be thinned using lapping, mechanical polishing, and/or chemo-mechanical polishing (CMP), in which a slurry such as silica is used because it has a chemical etch component. Furthermore, semiconductor device wafers or diced pieces can undergo surface preparation prior to depositing the adhesion layer 210. Surface preparation treatment may include solvent baths, dry etching, and/or sulfuric acid baths to remove organic contaminants. A wet GaN etch, using for example tetramethyl ammonium hydroxide (TMAH), may also be used. Other treatments, such as hydrofluoric and/orhydrochloric acids may also be used to remove oxides from the bottom surface of the substrate. One purpose of the surface treatment can be to provide a clean surface that adheres well and has low electrical contact resistance to adhesion layer 210. In some embodiments, the roughness of the back surface of GaN substrate 100 is optimized to promote acceptable adhesion of the adhesion layer and acceptable specific contact resistance between GaN substrate 100 and adhesion layer 210. In one embodiment, the root-mean-square (RMS) back surface roughness is between 1 and 200 nanometers.

Figure 3:
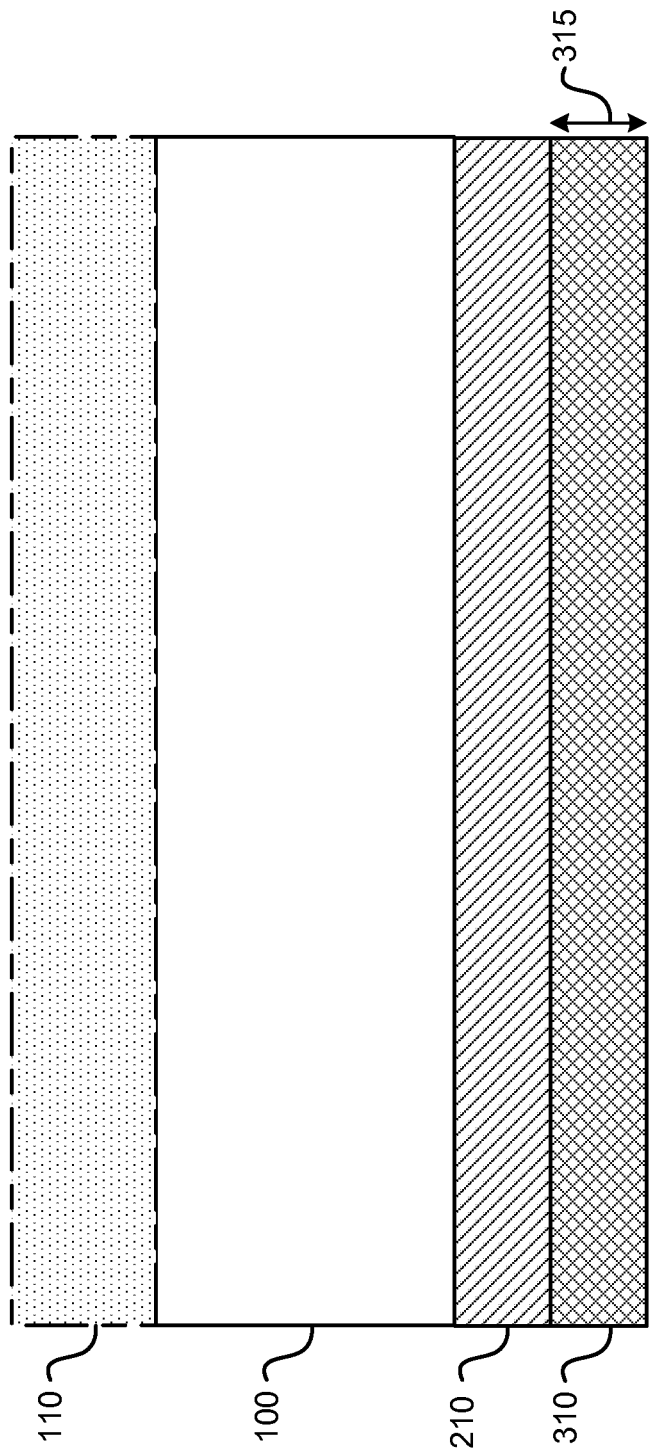

Referring to FIG. 3, a diffusion barrier 310 is formed, coupled to the adhesion layer 210. The diffusion barrier 310 can help protect the adhesion layer 210 from intermixing with other layers, including the solder, when the subsequent solder joint is formed, usually during a reflow process performed at temperatures above 200° C. In some embodiments, the diffusion barrier 310 substantially comprises nickel (Ni), which does not dissolve as quickly in molten solder as other elements. The thickness 315 of the diffusion barrier 310 could vary. This layer can be thick enough to serve as an effective barrier, but not so thick that it induces an unacceptable level of mechanical stress in the backside metal. In some embodiments, for example, the thickness 315 of the diffusion barrier 310 is between 50-300 nanometers thick. In addition or as an alternative to Ni, other acceptable materials for the diffusion barrier 310 may include molybdenum (Mo), platinum (Pt), or palladium (Pd).

Figure 4:
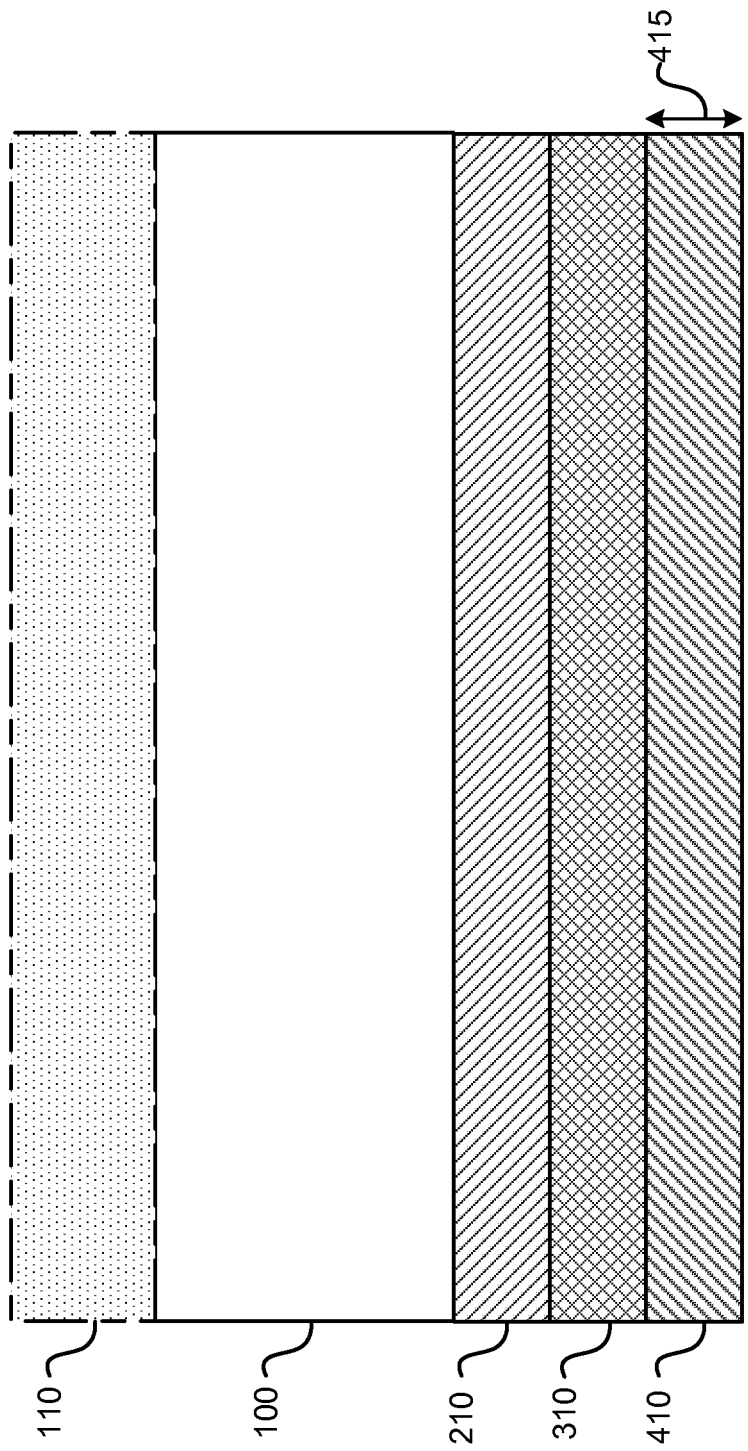

Referring to FIG. 4, a protection layer 410 is formed, coupled to the diffusion barrier 310. In some embodiments, the protection layer 410 can protect the diffusion barrier from oxidation, for example, and may dissolve partially or entirely in the solder during a soldering process. For example, the protection layer 410 may be a layer substantially comprising silver (Ag), because it dissolves in solder but does not adversely affect the solder's mechanical performance over time. Gold (Au) may also be used for protection layer 410, either alone or on top of a layer of Ag. As with other layers 210, 310 of the backside metal, the thickness 415 of the protection layer 410 could vary. In some embodiments, for example, the thickness 415 of the protection layer 410 is between 50-2000 nanometers thick.

Figure 5:
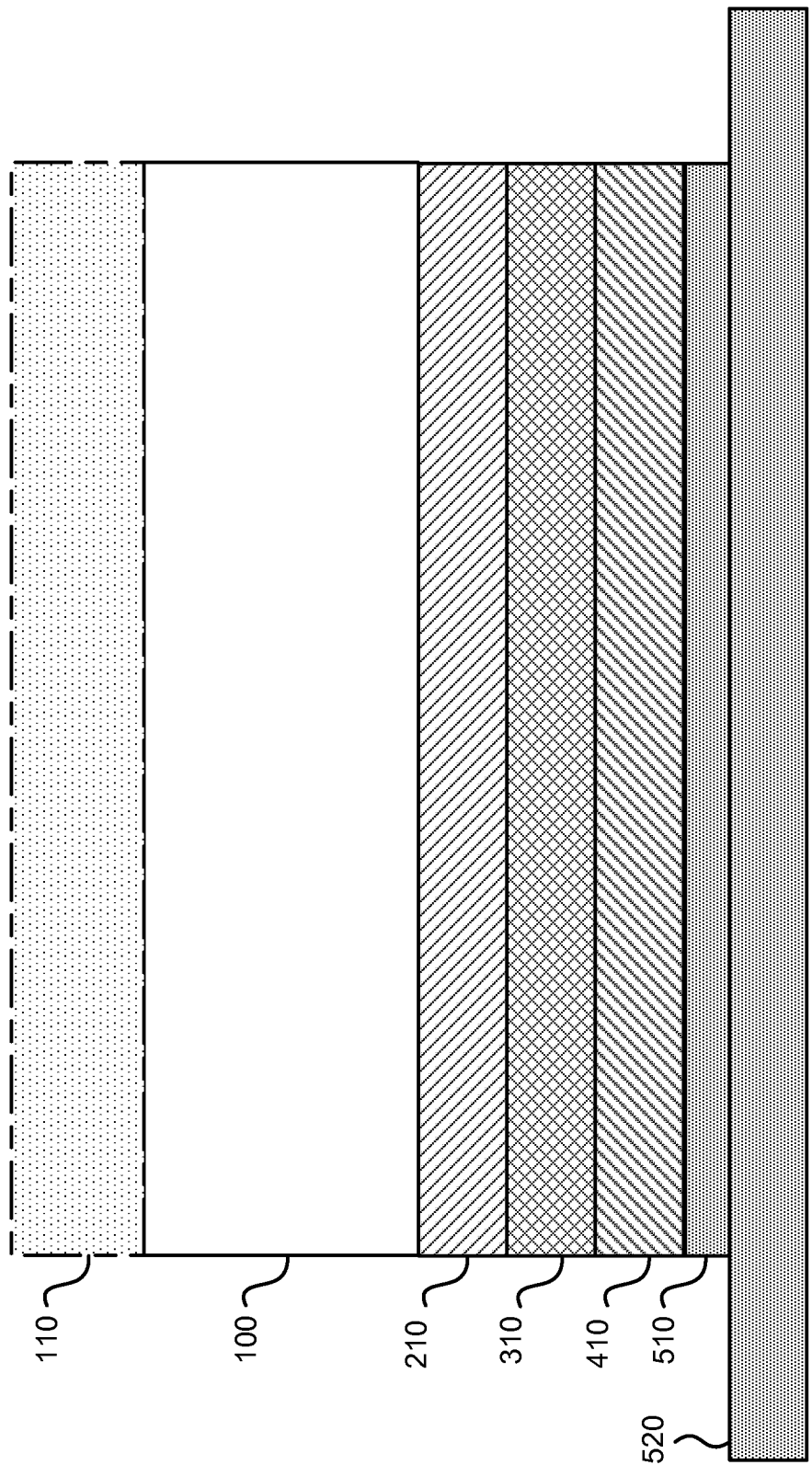

FIG. 5 is a simplified cross-sectional illustration of a process of using a layer of solder 510 to attach the vertical semiconductor device to a lead frame 520. In some embodiments, a die-attach solder 510 is placed on the metal lead frame 520 of a package (e.g. an integrated circuit package or a discrete power device package). Then, the singulated semiconductor device can be placed on top of the solder. In other embodiments, the solder can be disposed on the vertical semiconductor device before placement on the lead frame.

The form of the solder 510 can vary, depending on desired functionality. For example, the solder 510 can be in the form of a solder paste and/or solder preform. The composition of the solder 510 can also vary. In one embodiment, solder 510 comprises at least 80% lead (Pb). Solders with high lead content are relatively pliable, which can help prevent failure due to the different coefficient of thermal expansion (CTE) of the lead frame and the semiconductor material. In some embodiments the solder may comprise 85-98 wt % Pb, 0-10 wt % tin (Sn), and 0-5 wt % Ag. Two specific embodiments of solders are 2 wt % Sn, 95.5 wt % Pb, and 2.5 wt % Ag; and 1 wt % Sn, 97.5 wt % Pb, and 1.5 wt % Ag. In other embodiments, the solder may contain a combination of gold, tin, indium, or other suitable materials. The thickness 615 of the solder 510 can vary, depending on the desired solder joint thickness, composition, manufacturing concerns, and/or other factors. In one embodiment, the thickness 615 may be in the range of 10-100 microns.

Once the package, solder 510, and vertical semiconductor device are in place, they can be heated until the solder 510 melts. Soldering temperatures are typically in the range of 200-350° Celsius, and the heating process can take from about 1 to 30 minutes. The solder 510 solidifies as the package, solder, and chip are then cooled. As discussed above, at least a portion of protection layer 410 of the backside metal can dissolve in the solder 510 during this heating and cooling process.

Figure 6:
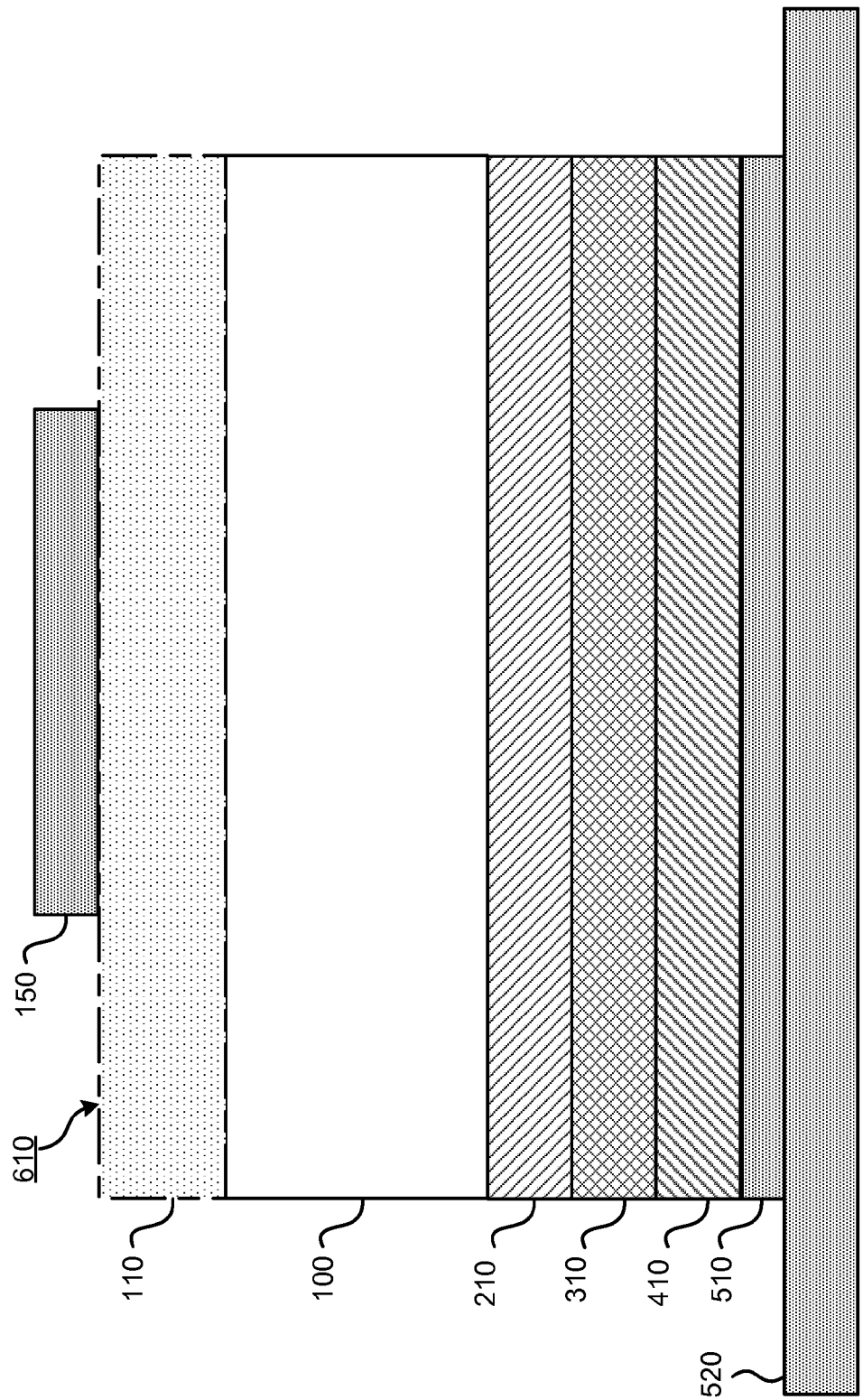

FIG. 6 shows the formation of a metal contact 150 on a top surface 610 of the vertical semiconductor device. The metal contact 150 can be one or more layers of metal and/or alloys to create a Schottky barrier or Ohmic contact with the device layer(s) 110, depending on desired functionality. The metal contact 150 can be formed using a variety of techniques, including lift-off and/or deposition with subsequent etching, which can vary depending on the metals used. In some embodiments, the metal contact 150 can include nickel, platinum, palladium, silver, gold, aluminum, and the like. It can be noted that the formation of the metal contact 150 can occur at different points during the manufacture of the vertical semiconductor device, including before and/or during the formation of any of the backside metal layers 210, 310, 410 and/or the soldering of the vertical semiconductor device to the lead frame 520.

The processes described in relation to FIGS. 2-6 are provided as an example only, and are not limiting. In some embodiments, any of a variety of processing steps may be taken to create the device layer(s) 110. Such processing steps can include, for example, deposition, implantation, etching, and/or other processing steps, which may be performed before, during, and/or after the steps depicted in FIGS. 2-6. Furthermore, the figures are not drawn to scale, and the manufacture of a solderable backside metal can include additional steps and/or features that are not shown. Moreover, as noted above, although these embodiments discussed GaN materials, other III-nitride materials may be used additionally or alternatively. The layers and/or structures described herein may include a number of sublayers, substructures, and/or other components to provide the functionality described herein. One of ordinary skill in the art would recognize many variations, modifications, and alternatives.

Figure 7:
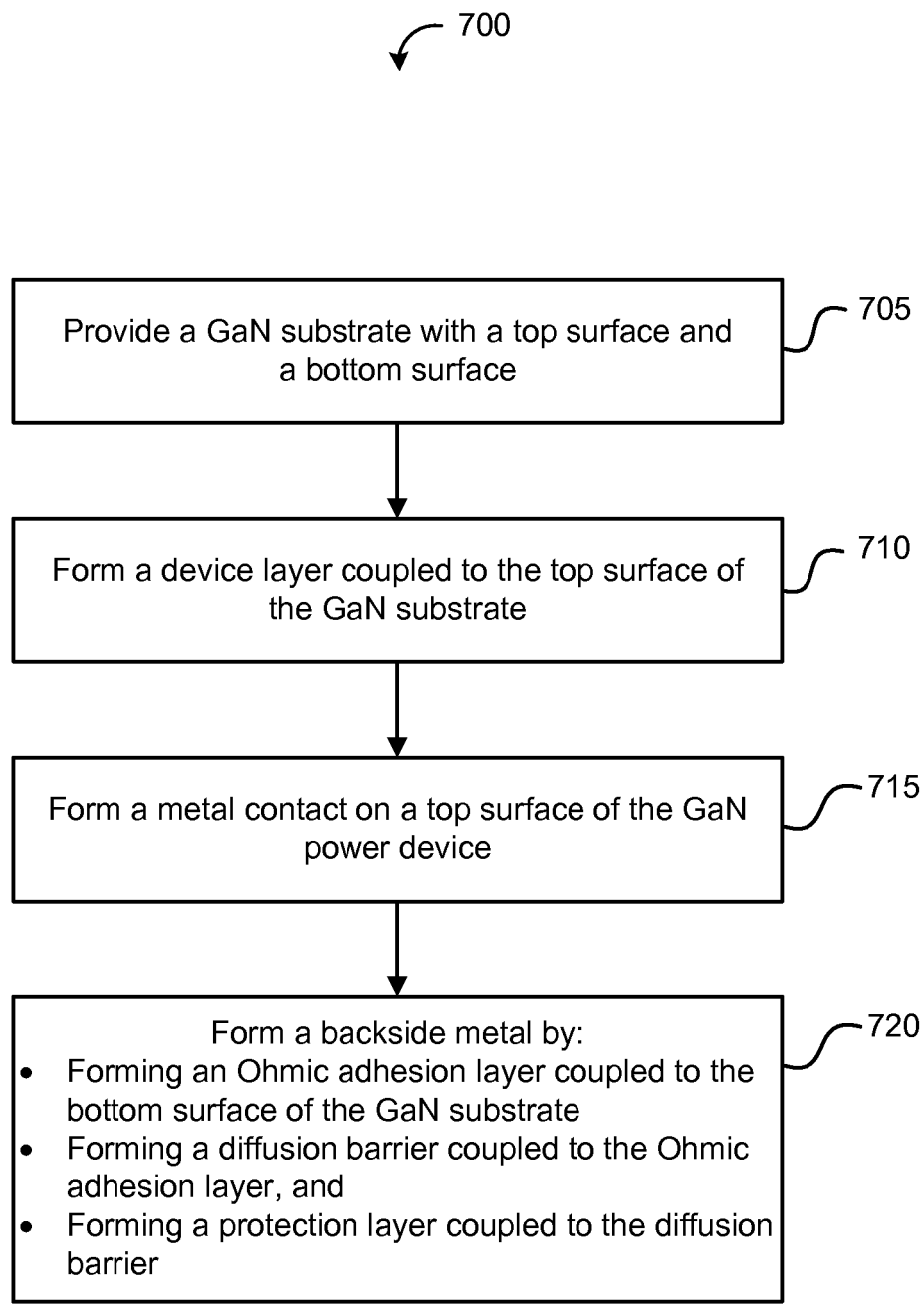
FIG. 7 is a flowchart illustrating a method 800 of fabricating a vertical GaN power device, according to an embodiment of the present invention.

FIG. 7 is a flowchart illustrating a method 700 of fabricating a vertical GaN power device, according to an embodiment of the present invention. The method 700 can begin by providing a GaN substrate with a top surface and a bottom surface (705). The GaN substrate can comprise a bulk Gallium Nitride (GaN) wafer, for example. In one embodiment, the GaN substrate has an n-type conductivity. A device layer coupled to the GaN substrate is then formed (710). In some embodiments, the device layer can comprise an active region including a GaN epitaxial layer. Moreover, in some embodiments, active region can have a lower doping concentration than the GaN substrate. As indicated above, the device layer may be one of a plurality of device layers formed on top of the GaN substrate. The physical properties of these one or more device layers can vary depending on the type of vertical GaN power device being fabricated.

A metal contact on a top surface of the GaN power device is formed (715). As discussed previously, the metal contact can be one of a plurality of metal contacts on a top surface of the GaN power device to provide an electrical contact to the GaN power device. Furthermore, the metal contact can comprise one or more metals and/or layers that may be formed before, after, and/or during the formation of a backside metal. Moreover, subsequent layers may be formed on the top surface of the GaN power device, depending on desired functionality.

A backside metal is formed (720). As discussed above, the backside metal can comprise three layers of metal formed on the GaN substrate. These metal layers can be formed, for example, by evaporation, sputtering, and/or electroplating. Although embodiments provided herein describe three metal layers, other embodiments may include a larger or smaller number of metal and/or other layers, depending on desired functionality, manufacturing concerns, and/or other factors.

According the method 700 of FIG. 7, forming the backside metal includes forming an Ohmic adhesion layer coupled to the bottom surface of the GaN substrate. As indicated previously, the bottom surface of the GaN substrate may be treated before the Ohmic adhesion layer is formed. Such treatment can include, for example lapping and/or polishing, surface preparation (e.g., acid baths to remove organic contaminants and/or oxides), and/or other treatments. In some embodiments, the Ohmic adhesion layer is a layer substantially comprising Al.

A diffusion barrier can be coupled to the Ohmic adhesion layer, as part of the backside metal. The diffusion barrier can comprise one or more materials to help protect the Ohmic adhesion layer from melting, thereby helping prevent diffusion between the Ohmic adhesion layer and subsequently-formed layers. As indicated elsewhere herein, in some embodiments, the diffusion layer substantially comprises Ni, which does not dissolve as readily in molten solder as other elements.

A protection layer can be coupled to the diffusion barrier, as part of the backside metal. The protection layer can comprise one or more materials to help protect the diffusion barrier from oxidation, contamination, and/or other processes that could deteriorate the solderability of the diffusion layer or the electrical or thermal performance of the vertical GaN power device. Some embodiments contemplate the use of a diffusion barrier that substantially comprises Ag because Ag can dissolve in solder without adversely affecting the solder's mechanical performance over time.

It should be appreciated that the specific steps illustrated in FIG. 7 provide a particular method of fabricating a vertical GaN power device according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. The steps shown in FIG. 7 may be performed in methods for fabricating vertical semiconductor devices other than power devices. Additionally or alternatively other semiconductor materials such as other III-nitride materials may be used in addition to or as a substitute for GaN as provided in the method 700 shown in FIG. 7. One of ordinary skill in the art would recognize many variations, modifications, and alternatives.

In a manner similar to the techniques discussed in relation to FIGS. 1-7, a top metal contact (e.g., metal contact 130 of FIG. 1) can include a metal stack with various layers to provide a bondable contact surface to electrically-conducting structures such as bonding wires, ribbons, leads, and the like may be coupled during the packaging of a semiconductor device.

Figure 8:
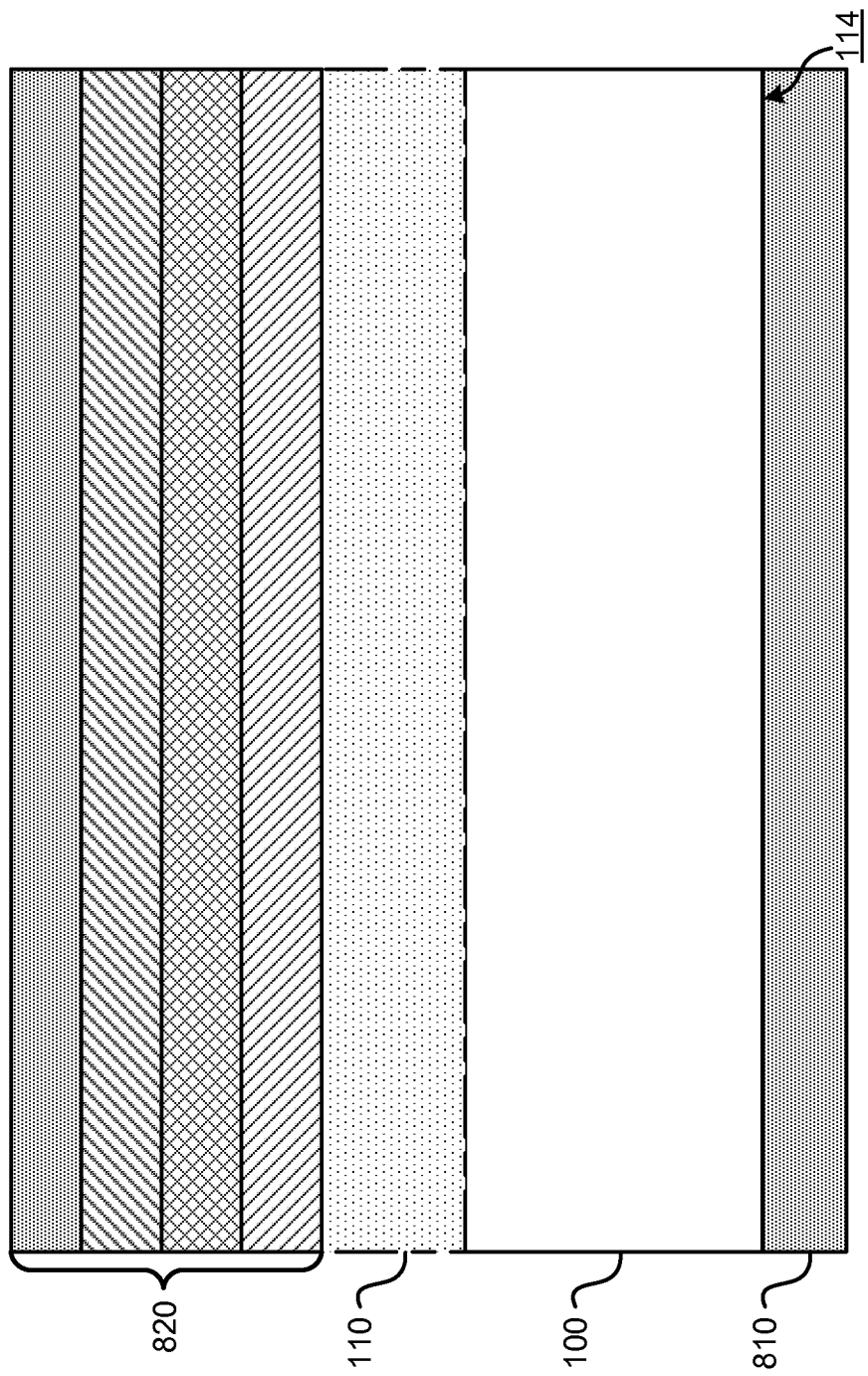
FIG. 8 is a simplified cross-sectional diagram illustrating an embodiment of a vertical semiconductor device showing the metal stack of a top metal contact.

FIG. 8 is a simplified cross-sectional diagram illustrating an embodiment of a vertical semiconductor device showing the metal stack of a top metal contact. In general, embodiments can include a GaN substrate 100, device layer(s) 110, a back metal 810 (which can comprise a metal stack as discussed previously), and a top metal contact 820. Although the embodiment shown in FIG. 8 and elsewhere herein describes the use of GaN materials, it will be understood that other semiconductor materials, including III-nitride semiconductor materials, can be used. Furthermore, as indicated above, it will be understood that a multiple top metal contacts may be utilized by a single semiconductor device.

Similar to the embodiments shown in FIGS. 1A-1B, the form and function of the device layer(s) 110 can vary significantly, depending on desired functionality. Device layer(s) 110 can include, for example, one or more active regions, drift regions, PN junctions, P-I-N junctions, merged P-I-N Schottky (MPS) junctions, doped regions, intrinsic regions, insulating regions, and/or the like, depending on the functionality of the vertical semiconductor device. Examples of vertical semiconductor devices can include JFETs, MOSFETs, MESFETS, BJTs, HBTs, diodes, and the like.

The top metal contact 820 of the vertical semiconductor device of FIG. 8 can be utilized, along with back metal 810, to provide a low-resistivity path for current to flow in a vertical direction through the device, from a top surface through the device layer(s) 110 to the bottom surface 114 of the GaN substrate 100, and/or vice versa. This low resistivity connection facilitating vertical current flow is particularly beneficial for vertical power devices, and the composition of the top metal contact 820 can provide a bondable electrical contact to the vertical semiconductor device.

FIGS. 9-12 illustrate a particular embodiment of a process for creating a bondable top metal contact on a vertical semiconductor device. Although the figures show only one vertical semiconductor device with one top metal contact, the process described can be extended and/or modified to include the simultaneous manufacture of multiple vertical semiconductor devices and/or multiple top metal contacts as shown, for example, in FIG. 1B.

Figure 9:
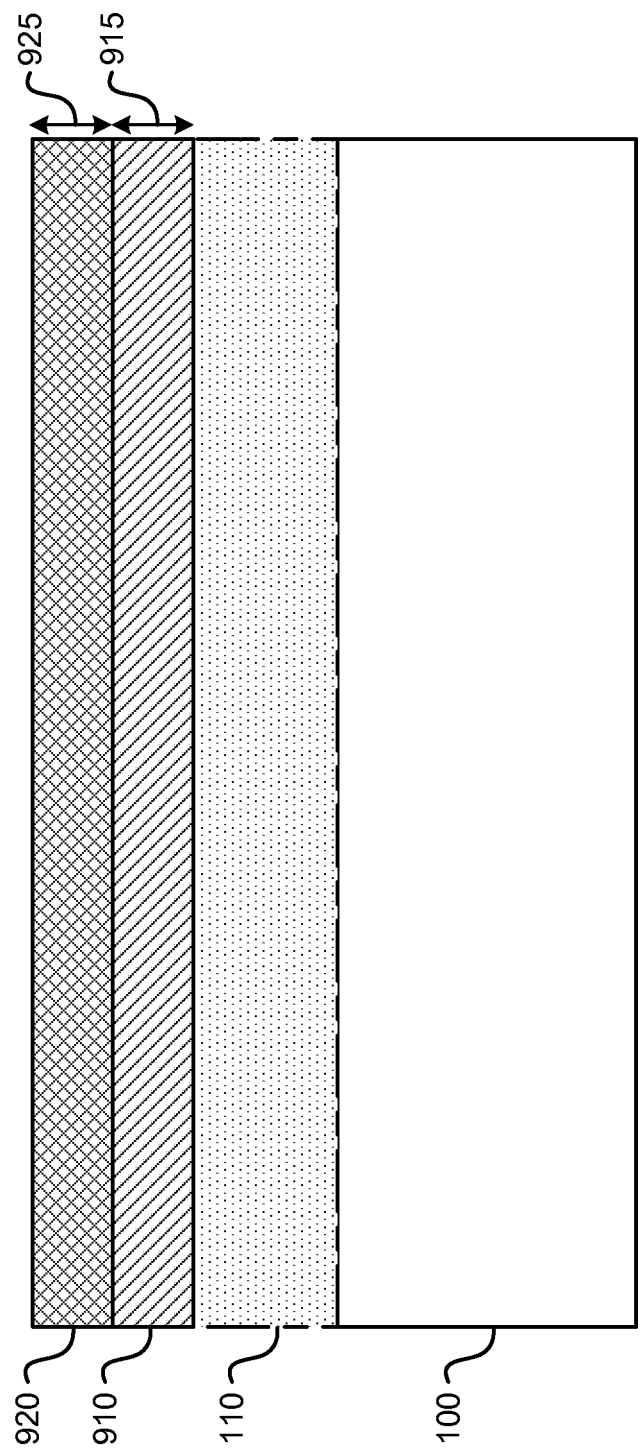
FIGS. 9-12 are illustrations of a particular embodiment of a process for creating a bondable contact surface on a vertical semiconductor device.
Figure 10:
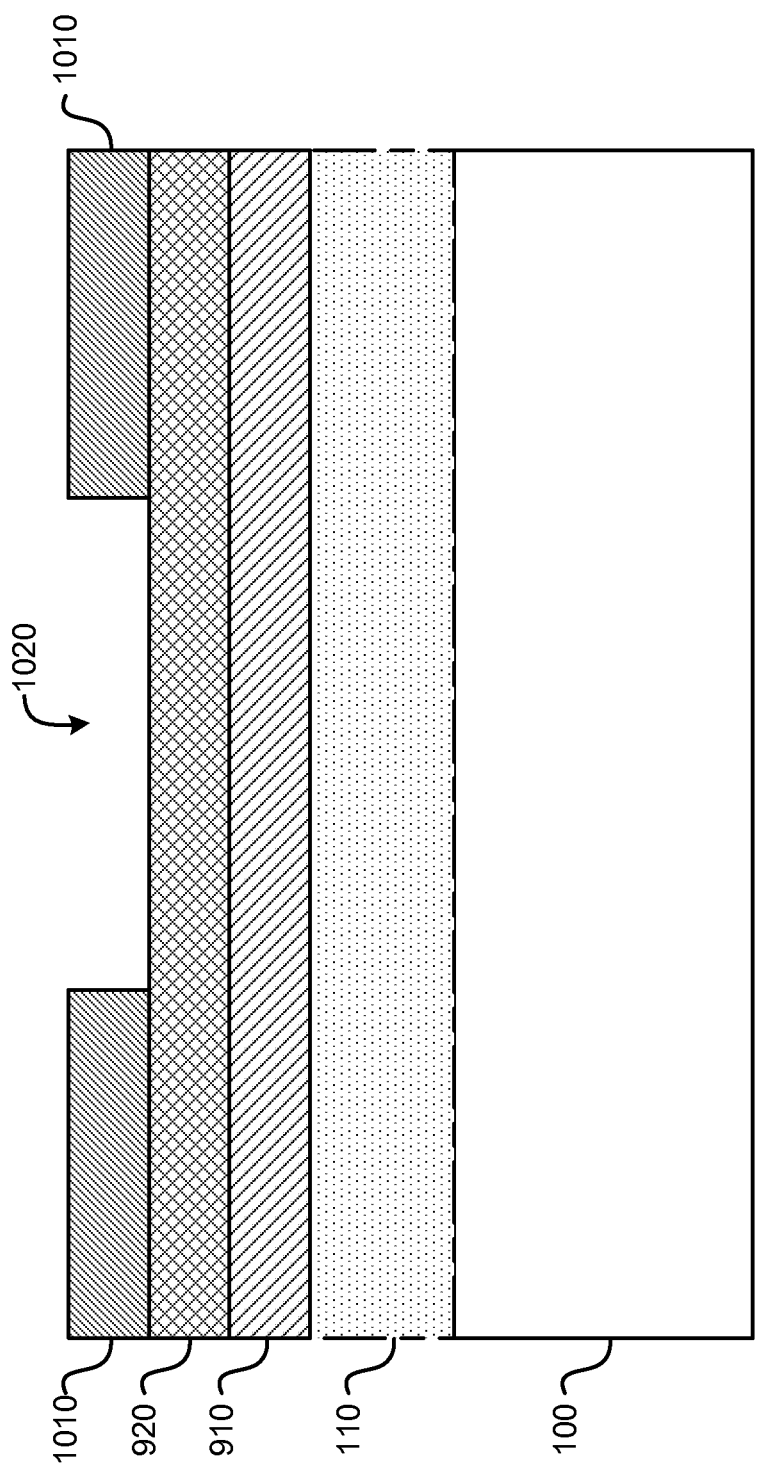

Referring to FIG. 9, a contact metal 910 is formed on a top surface of a vertical semiconductor device, which includes a GaN substrate 100 and device layer(s) 110. Embodiments contemplate utilizing a contact metal 910 comprising Pt, Pd, Ni, Ti, Al, and/or similar materials. The contact metal 910 can be formed by any of a variety of processes, such as evaporation, sputtering, electroplating, and the like. In some embodiments, the protection layer 920 and/or the contact metal 910 can be patterned and/or otherwise defined using a lift off process. In other embodiments, the contact metal 910 can be patterned by a masking and etching process.

The contact metal 910 can provide a Schottky and/or Ohmic contact with the device layer(s) 110, depending on desired functionality of the vertical semiconductor device. In one embodiment, for example, a contact metal 910 comprising Pt, Pd, and/or Ni can be used to form an Ohmic contact to highly doped p-type GaN device layer(s) 110. Such an Ohmic contact can be formed at room temperature without requiring a high temperature anneal. In some embodiments, the Ohmic contact can be further improved by a rapid-thermal anneal (RTA) of, for example, between about 200° C. and 800° C. for approximately one minute.

In addition, or as an alternative, to an Ohmic contact to highly doped p-type GaN, contact metal 910 can provide a Schottky contact to lightly doped n-type GaN. Again Pt, Pd, and/or Ni can be used to provide the Schottky contact, although embodiments may use other materials additionally or alternatively. The contact metal 910, as deposited, can provide a Schottky contact without subsequent anneals. In some embodiments, a top surface of GaN device layer(s) 110 comprise some areas of highly doped p-type GaN and some areas of lightly doped n-type GaN. The same contact metal 910, with or without annealing, can simultaneously form an Ohmic contact to the p-type GaN and a Schottky contact to the n-type GaN. In one embodiment, this construction may be used to fabricate a vertical merged PN Schottky (MPS) device.

In other embodiments, device layer(s) 110 may comprise highly doped n-type GaN and an Ohmic contact may be formed by contact metal 910 comprising Ti and/or Al., Such an Ohmic contact can be formed at room temperature without requiring a high temperature anneal. In some embodiments, the Ohmic contact may be further improved by an RTA of between about 200° C. and 800° C. for approximately one minute. Additionally or alternatively the contact metal 910 and/or other layers may be annealed during subsequent high-temperature steps (e.g., passivation). Embodiments not utilizing an anneal, however, can be beneficial due to simplified processing of the devices and removal of the possibility of an anneal negatively affecting other aspects of the device.

The thickness 915 of the contact metal 910 can vary. In some embodiments, for example, thickness 915 of the contact metal 910 can be between approximately 20 and 100 nanometers thick. Furthermore, as with other embodiments provided herein, respective thicknesses of the GaN substrate 100 and the device layer(s) 110, as well as other properties (e.g., dopant concentration, shape, composition, etc.), also can vary depending on the type of semiconductor devices being fabricated, desired functionality, manufacturing concerns, and/or other factors. Although the GaN substrate 100 is illustrated as including a single material composition, multiple layers can be provided as part of the substrate. Moreover, adhesion, buffer, and other layers (not illustrated) can be utilized during an epitaxial growth process. One of ordinary skill in the art would recognize many variations, modifications, and alternatives.

The vertical semiconductor device can also include a protection layer 920 coupled to the contact metal 910. In some embodiments, the protection layer 920 can protect the contact metal 910 from oxidation. For example, the protection layer 920 may be a layer substantially comprising Au, which can be highly resistant to many wet and dry etching, cleaning, and deposition processes. As with the contact metal 910, the thickness 925 of the protection layer 920 can vary. The thickness 925 can be approximately 80 nanometers in some embodiments. In some embodiments, the thickness 925 of the protection layer 920 can be between 25 and 250 nanometers.

Because the protection layer 920 can shield the contact metal 910 from processing steps, it can provide flexibility in processing by allowing for a pause in the formation of the top metal contact's metal stack. For example, referring to FIG. 10, a dielectric layer 1010 can be coupled to the protection layer 920. This dielectric layer 1010 can comprise an oxide and/or other dielectric that can be patterned (e.g., through a lithographic masking and etching process) to provide a window 1020 that exposes a surface of the vertical semiconductor device to which subsequent electrical contact can be formed (e.g., a surface electrically coupled to an active region of the vertical semiconductor device).

Figure 11:
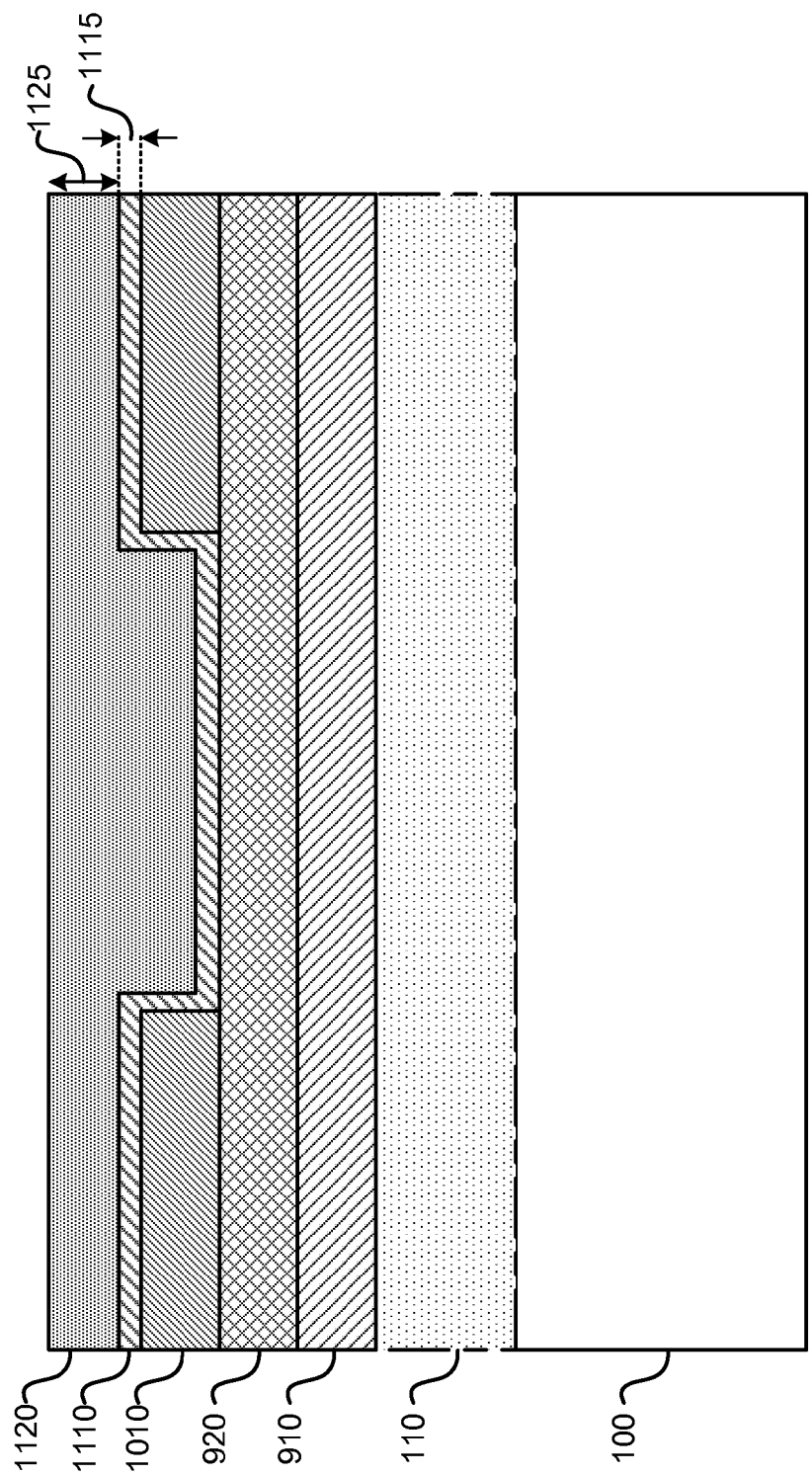

Referring to FIG. 11, the metal stack of the top metal contact further can comprise a diffusion barrier 1110 and pad metal 1120. The diffusion barrier 1110, coupled with the protection layer 920, can help prevent the protection layer 920 from intermixing with other layers placed on top of the diffusion barrier 1110. For example, for a protection layer 920 comprising Au and a pad metal 1120 comprising Al, the diffusion barrier 1110 can help prevent the protection layer 920 and pad metal 1120 from diffusing into each other and forming highly resistive intermetallics, like $Au_5Al_2$ and $AuAl_2$. Furthermore, depending on the composition of the protection layer 920 and pad metal 1120, the diffusion barrier 1110 can also act as an adhesion layer. Acceptable materials for the diffusion barrier 1110 can include Ni, Mo, Ti, titanium nitride (TiN) and/or Cr. In one embodiment, diffusion barrier 1110 includes a bottom layer of Ti, which adheres well to both protection layer 920 and dielectric layer 1010, and an upper layer of Ni which provides an effective diffusion barrier. The thickness of the diffusion barrier can vary, depending on processing concerns (e.g., coverage), as well as other factors. In some embodiments, for example, the thickness 1115 of the diffusion barrier 1110 can be between 25 and 400 nanometers thick.

The pad metal 1120 provides a bondable surface to which wire (and/or other types) of bonds may be formed. Thick aluminum (Al) wires bonds are commonly used, for example, to form contacts in power electronics. Larger diameter (e.g. 50-500 micron) Al wires provide a high current and low resistance path to the semiconductor device. In some embodiments, the pad metal can comprise Al, which is easily deposited, inexpensive, and readily bondable to Al bond wires. Additionally or alternatively, other materials, such as Cu, can be used. Furthermore, physical features and/or patterns of the pad metal 1120 and/or the diffusion barrier 1110 can be defined by material removal processes, such as a lithographical wet etch.

The thickness 1125 of the pad metal 1120 can vary, depending on composition, desired functionality, and/or other factors. The pad metal 1120 can be relatively thick to help ensure the structural integrity of the pad metal 1120 can withstand a subsequent wire bonding process. In particular, the Al wire bonding process exerts large forces on the pad metal. A thick pad metal can absorb these forces to prevent damage to the underlying GaN device layers. In some embodiments, for example, the thickness 1125 of the pad metal 1120 can be between 2 and 6 microns. In one embodiment, thickness 1125 is in the range of 3.5 to 4.5 microns.

In some embodiments, pad metal 1120 and diffusion barrier 1110 are patterned into one or more isolated regions that function as the top electrodes of the vertical GaN power device (e.g. a source electrode and a gate electrode). This patterning may be accomplished using lift-off processes and/or masking and etching processes. In one embodiment, pad metal 1120 comprises Al with a thickness of approximately 4 microns, diffusion barrier 1110 comprises Ni with a thickness or approximately 200 nanometers, and one or more wet etching steps are used to pattern both of these layers using a single photomask. In another embodiment, diffusion barrier 1110 further comprises a layer of Ti with a thickness of about 20 nanometers underlying the Ni, and the Ti is patterned using a lift-off process. In another embodiment, the pad metal has a thickness of at least 2 microns and comprises Al and/or Cu.

Figure 12:
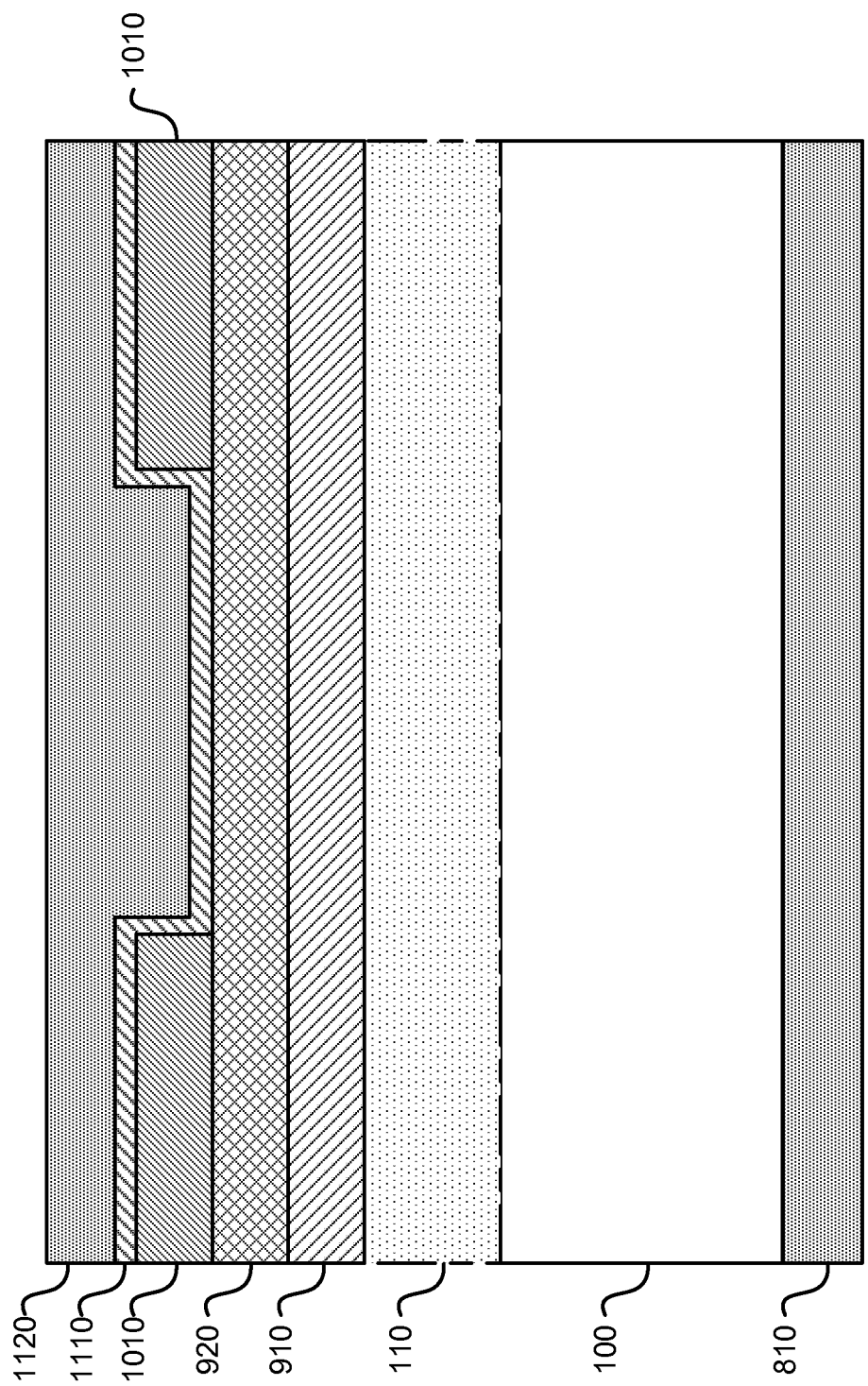

FIG. 12 illustrates the formation of a back metal 810 on a bottom surface of the GaN substrate 100. The back metal 810 can be formed using processes such as evaporation, sputtering, and/or electroplating, and can provide an Ohmic electrical contact to the bottom of the vertical semiconductor device, according to some embodiments. Furthermore, the back metal 810 may comprise a metal stack, such as the solderable stack discussed previously in relation to FIGS. 1-7.

Figure 13:
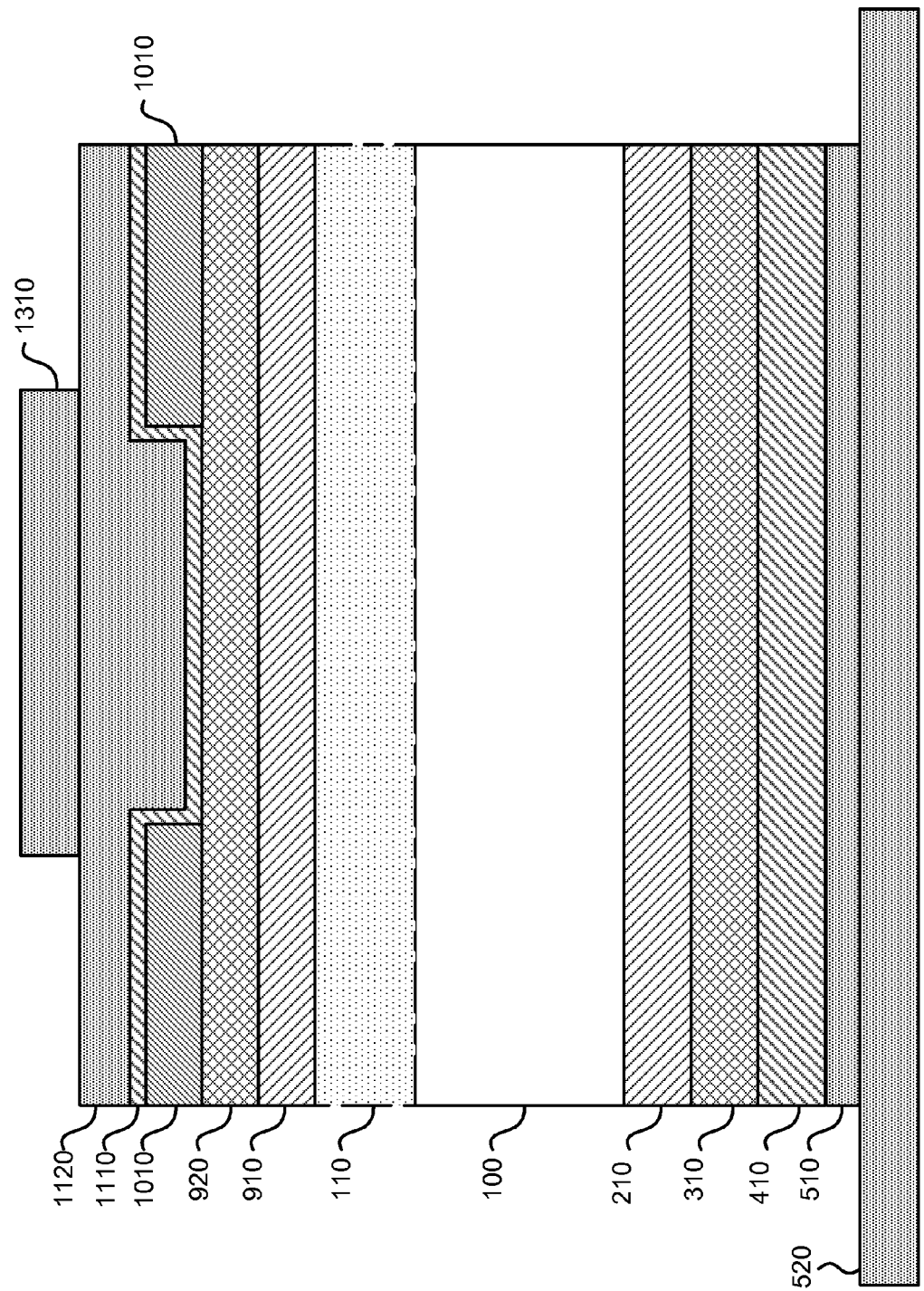
FIG. 13 illustrates an embodiment of a vertical semiconductor device including components for both a bondable top metal contact and a solderable backside metal.

FIG. 13 illustrates such an embodiment of a vertical semiconductor device including components described herein for both a bondable top metal contact (bonded with a bond wire 1310) and a solderable backside metal. The various elements of FIG. 13 are described above. In one embodiment, the packaged vertical GaN power device of FIG. 13 includes an Al bond wire 1310 providing current flow from the package to the top of the power device. Top metal layers 1120, 1110, 920, and 910 provide a low resistance path for current to flow from bond wire 1310 into GaN device layer(s) 110. These top metal layers also exhibit good adhesion to the GaN device layer(s) and protect the GaN device layer(s) from damage during the wire bonding processes. Current flows substantially vertically through GaN device layers 110 and GaN substrate 100. Backside metal layers 210, 310, and 410, along with die-attach solder 510, provide a low resistance path for current to flow from GaN substrate 100 and lead frame 520. Thus, a vertical GaN power device is provided that is compatible with the preferred power device packaging techniques of solder die attach and Al wire bonding.

The processes described in relation to FIGS. 8-13 are provided as an example only, and are not limiting. In some embodiments, any of a variety of processing steps may be taken to create the device layer(s) 110. Such processing steps can include, for example, deposition, implantation, etching, and/or other processing steps, which may be performed before, during, and/or after the steps depicted in FIGS. 8-13. Furthermore, the figures are not drawn to scale, and the manufacture of a bondable top metal contact can include additional steps and/or features that are not shown. Moreover, as noted above, although these embodiments discussed GaN materials, other III-nitride materials may be used additionally or alternatively. The layers and/or structures described herein may include a number of sublayers, substructures, and/or other components to provide the functionality described herein. One of ordinary skill in the art would recognize many variations, modifications, and alternatives.

Figure 14:
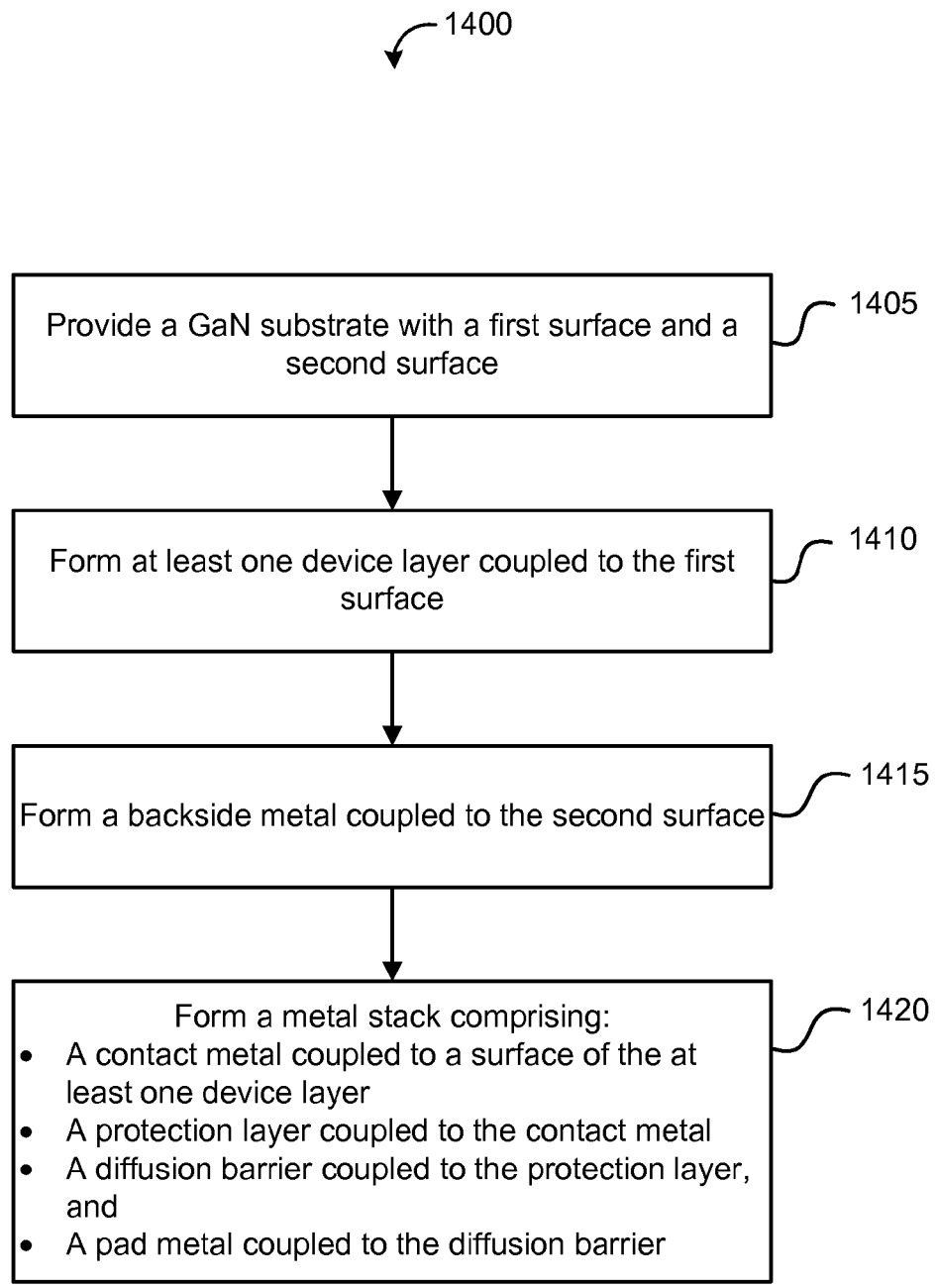
FIG. 14 is flowchart illustrating a method of fabricating a vertical GaN power device, according to an embodiment of the present invention.

FIG. 14 is a flowchart illustrating a method 1400 of fabricating a vertical GaN power device, according to an embodiment of the present invention. The method 1400 can begin by providing a GaN substrate with a first and second surface (1405). The GaN substrate can comprise a bulk GaN wafer, for example. In one embodiment, the GaN substrate has highly-doped n-type conductivity. At least one device layer is formed, coupled to the first surface of the GaN substrate (1410). In some embodiments, the at least one device layer can comprise one or more active regions. Thicknesses, doping concentrations, and other physical properties can vary depending on device type and desired functionality.

A backside metal is coupled to the second surface of the GaN substrate (1415). The backside metal can provide an electrical contact to the GaN power device, and can comprise one or more metals and/or layers, such as the solderable metal stack provided herein above. The backside metal, or portions thereof, may be formed before, after, and/or during the formation of a metal stack of a top metal contact. Moreover, subsequent layers may be formed on the second surface of the GaN power device, depending on desired functionality.

A top metal stack of is formed (1420), which can provide a top metal contact to the vertical GaN power device. As discussed above, the top metal can include four layers comprising metal formed on the at least one device layer. These metal layers can be formed, for example, by evaporation, sputtering, and/or electroplating. Although embodiments provided herein describe four metal layers, other embodiments may include a larger or smaller number of metal and/or other layers, depending on desired functionality, manufacturing concerns, and/or other factors.

According the method 1400 of FIG. 14, forming the metal stack includes forming a contact metal coupled to a surface of the at least one device layer. As indicated previously, the contact metal can include any of a variety of metals, such as Pt, Pd, Ti, Al, TiN, Ag, and/or Ni. Depending on the device type and functionality of the vertical GaN power device, the contact metal can form and Ohmic contact, a Schottky contact, or both.

A protection layer can be coupled to the contact metal, as part of the metal stack. The protection layer can comprise one or more materials to help protect the contact metal from oxidation, contamination, and/or other processes that could deteriorate the performance of the vertical GaN power device. Some embodiments contemplate the use of a diffusion barrier that comprises Au.

A diffusion barrier can be coupled to the protection layer, as part of the metal stack. The diffusion barrier can comprise one or more materials to help protect the protection layer from diffusing with the subsequently-formed pad metal. As indicated elsewhere herein, in some embodiments, the diffusion layer can comprise Ni, Cr, Mo, Ti, W, and/or TiN.

A pad metal is coupled to the diffusion barrier. The pad metal can comprise a material, such as Al and/or Cu, which provides a surface to which a bond wire, ribbon, lead, and/or other electrical conductor can be bonded. The pad metal can be relatively thick to help ensure that the device layers are not damaged during the bonding process.

It should be appreciated that the specific steps illustrated in FIG. 14 provide a particular method of fabricating a vertical GaN power device according to an embodiment of the present invention. Other sequences of steps may also be performed according to alternative embodiments. For example, alternative embodiments of the present invention may perform the steps outlined above in a different order. Moreover, the individual steps illustrated in FIG. 14 may include multiple substeps that may be performed in various sequences as appropriate to the individual step. Furthermore, additional steps may be added or removed depending on the particular applications. The steps shown in FIG. 14 may be performed in methods for fabricating vertical semiconductor devices other than power devices. Additionally or alternatively other semiconductor materials such as other III-nitride materials may be used in addition to or as a substitute for GaN as provided in the method 1400 shown in FIG. 14. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor device, comprising:
   a gallium nitride (GaN) substrate having a first surface and a second surface, the second surface being substantially opposite the first surface;
   at least one device layer coupled to the first surface;
   a backside metal coupled to the second surface and comprising:
      an adhesion layer coupled to the second surface of the GaN substrate;
      a first diffusion barrier coupled to the adhesion layer; and
      a first protection layer coupled to the first diffusion barrier; and
   a top metal stack coupled to the at least one device layer and comprising:
      a contact metal coupled to a surface of the at least one device layer;
      a second protection layer coupled to the contact metal;
      a dielectric layer comprising a gap;
      a second diffusion barrier over the dielectric layer and over the second protection layer in the gap of the dielectric layer; and
      a pad metal coupled to the second diffusion barrier;
   wherein
      the semiconductor device is configured to conduct electricity between the top metal stack and the backside metal.

2. The semiconductor device of claim 1 wherein the contact metal forms an Ohmic contact with at least a portion of the at least one device layer.

3. The semiconductor device of claim 1 wherein the contact metal forms a Schottky contact with at least a portion of the at least one device layer.

4. The semiconductor device of claim 1 wherein the contact metal comprises at least one of:
   platinum,
   palladium,
   titanium,
   titanium nitride,
   aluminum,
   silver, or
   nickel.

5. The semiconductor device of claim 1 wherein either or both of the first protection layer or the second protection layer comprises gold.

6. The semiconductor device of claim 1 wherein the pad metal has a thickness of at least 2 microns and comprises at least one of:
   aluminum, or
   copper.

7. The semiconductor device of claim 1 wherein either or both of the first diffusion barrier or the second diffusion layer comprises at least one of:
   nickel,
   chromium,
   molybdenum,
   tungsten, or
   titanium.

8. The semiconductor device of claim 1 further comprising an aluminum bond wire electrically connecting the pad metal to a package.

9. The semiconductor device of claim 1 further comprising a solder mechanically and electrically connecting the backside metal to a lead frame.

10. The semiconductor device of claim 1 wherein the adhesion layer comprises at least one of:
    Ti,
    Al,
    Pd, and
    Cr.

* * * * *